US010829394B2

(12) United States Patent
Taghipour

(10) Patent No.: US 10,829,394 B2
(45) Date of Patent: Nov. 10, 2020

(54) HEAT DISSIPATION APPARATUS AND METHODS FOR UV-LED PHOTOREACTORS

(71) Applicant: THE UNIVERSITY OF BRITISH COLUMBIA, Vancouver (CA)

(72) Inventor: Fariborz Taghipour, Burnaby (CA)

(73) Assignee: The University of British Columbia, Vancouver (CA)

( * ) Notice: Subject to any disclaimer, the term of this patent is extended or adjusted under 35 U.S.C. 154(b) by 0 days.

(21) Appl. No.: 16/071,466

(22) PCT Filed: Jan. 19, 2017

(86) PCT No.: PCT/CA2017/050061
§ 371 (c)(1),
(2) Date: Jul. 19, 2018

(87) PCT Pub. No.: WO2017/124191
PCT Pub. Date: Jul. 27, 2017

(65) Prior Publication Data
US 2019/0062180 A1 Feb. 28, 2019

Related U.S. Application Data

(60) Provisional application No. 62/280,630, filed on Jan. 19, 2016.

(51) Int. Cl.
*C02F 1/32* (2006.01)
*H05K 1/02* (2006.01)
*H05K 1/18* (2006.01)
*H05K 7/20* (2006.01)
*C02F 103/02* (2006.01)

(52) U.S. Cl.
CPC ........... *C02F 1/325* (2013.01); *H05K 1/0204* (2013.01); *H05K 1/181* (2013.01);
(Continued)

(58) Field of Classification Search
CPC ... C02F 1/32; H05K 1/02; H05K 1/18; H05K 7/20
See application file for complete search history.

(56) References Cited

U.S. PATENT DOCUMENTS 5,288,461 A    2/1994 Gray
2008/0085224 A1* 4/2008 Cheng ............... A61L 9/205
                                                422/186.3
(Continued)

FOREIGN PATENT DOCUMENTS

WO    2006134567 A1    12/2006
WO    WO-2014187523 A1 * 11/2014 ............. C02F 1/325

OTHER PUBLICATIONS

Supplemental European Search Report received in European Patent Application No. 17740938.0, dated Jul. 29, 2019.
(Continued)

*Primary Examiner* — Walter D. Griffin
*Assistant Examiner* — Cameron J Allen
(74) *Attorney, Agent, or Firm* — Kilpatrick Townsend & Stockton LLP

(57) ABSTRACT

A UV reactor irradiates a flow of fluid with UV radiation. The reactor comprises: a fluid conduit defined by a heat conducting conduit body comprising one or more heat conducting walls for permitting a flow of fluid therethrough; a UV-LED operatively connected to a PCB and oriented for directing radiation into the fluid conduit. The PCB comprises a heat conducting substrate having a first surface. The conduit body is in thermal contact with the first surface of the heat conducting substrate. Heat is dissipated from the UV-LED via the heat conducting substrate, the thermal contact between the first surface of the heat conducting substrate and the heat conducting conduit body, and from the
(Continued)

one or more heat conducting walls of the heat conducting conduit body to the fluid flowing through the fluid conduit.

32 Claims, 8 Drawing Sheets

(52) U.S. Cl.
CPC .... *H05K 7/20272* (2013.01); *C02F 2103/026* (2013.01); *C02F 2201/326* (2013.01); *C02F 2201/328* (2013.01); *C02F 2201/3222* (2013.01); *C02F 2201/3227* (2013.01); *C02F 2301/028* (2013.01); *C02F 2303/04* (2013.01); *C02F 2307/10* (2013.01); *H05K 2201/10106* (2013.01)

(56) References Cited

U.S. PATENT DOCUMENTS

| | | | |
|---|---|---|---|
| 2015/0114912 A1* | 4/2015 | Taghipour | C02F 1/325 210/748.11 |
| 2015/0129776 A1* | 5/2015 | Boodaghians | C02F 1/325 250/432 R |
| 2015/0336810 A1 | 11/2015 | Smetona | |
| 2016/0083272 A1* | 3/2016 | Rajagopalan | C02F 1/325 250/435 |
| 2019/0030510 A1 | 1/2019 | Taghipour | |

OTHER PUBLICATIONS

Taghipour, Fariborz, 'Modeling and Design of Ultraviolet Reactors for Disinfection by-Product Precursor Removal', Desalination, 176, 2005, pp. 71-80.

International Search Report received in the corresponding International Application No. PCT/CA2017/050061, dated Apr. 20, 2017.

Chung, D.D.L., "Materials for thermal conduction", *Applied Thermal Engineering*, Nov. 2001, vol. 21 (16), pp. 1593-1605.

Elyasi, Siamak, et al., 'Simulation of UV photoreactor for water disinfection in Eulerian framework'.

\* cited by examiner

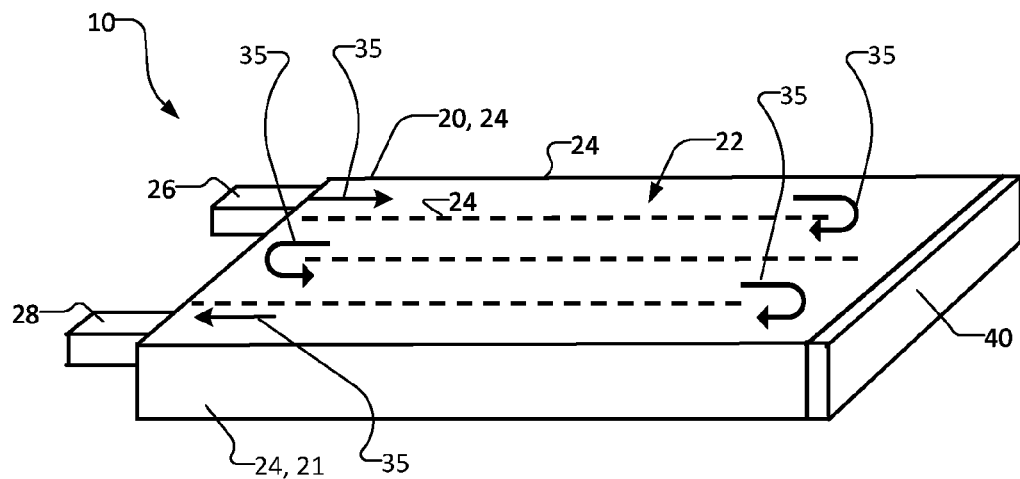
FIGURE 1A
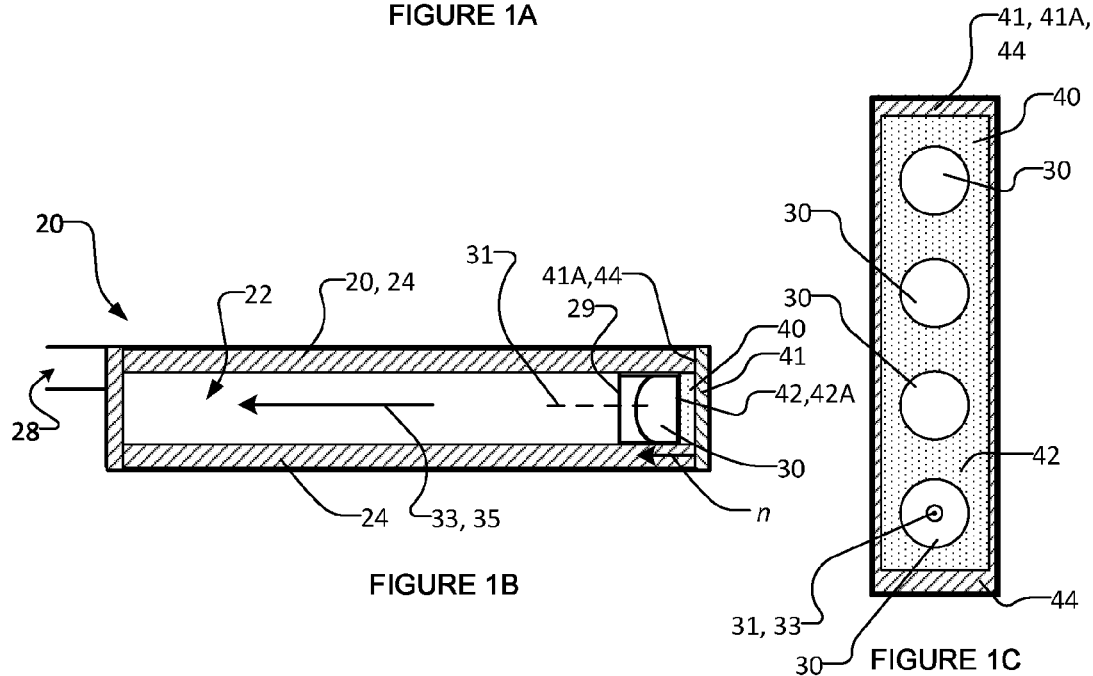
FIGURE 1B
FIGURE 1C

HEAT DISSIPATION APPARATUS AND METHODS FOR UV-LED PHOTOREACTORS

REFERENCE TO RELATED APPLICATIONS

This application claims priority from U.S. Application No. 62/280,630 filed on 19 Jan. 2016 and entitled HEAT DISSIPATION APPARATUS AND METHODS FOR UV-LED PHOTOREACTORS. For purposes of the United States, this application claims the benefit under 35 U.S.C. § 119 of U.S. Application No. 62/280,630 filed on 19 Jan. 2016 and entitled HEAT DISSIPATION APPARATUS AND METHODS FOR UV-LED PHOTOREACTORS. U.S. application No. 62/280,630 is hereby incorporated herein by reference for all purposes.

TECHNICAL FIELD

The present invention relates to thermal management for ultraviolet light (radiation) emitting diode (UV-LED) reactors used to irradiate fluids. Particular embodiments provide apparatus and methods for providing heat dissipation for UV-LEDs and/or other heat producing electronic devices used in UV-LED photoreactors.

BACKGROUND

Ultraviolet (UV) reactors—reactors that administer UV radiation—are applied to many photoreactions, photocatalytic reactions, and photo-initiated reactions. One application for UV reactors is for water and air purification. In particular, UV reactors have emerged in recent years as one of the most promising technologies for water treatment. Prior art UV reactor systems typically use low- and medium-pressure mercury lamps to generate UV radiation.

Light (radiation) emitting diodes (LEDs) typically emit radiation of such narrow bandwidth that radiation emitted by LEDs may be considered (for many applications) to be monochromatic (i.e. of a single wavelength). With recent advances in LED technology, LEDs may be designed to generate UV radiation at different wavelengths, which include a wavelength for DNA absorption as well as wavelengths that can be used for photocatalyst activation. UV-LEDs have many advantages compared to traditional mercury UV lamps, including, without limitation, compact and robust design, lower voltage and power requirements, and the ability to turn on and off with high frequency. These advantages of UV-LEDs make them an attractive alternative for replacing UV lamps in UV reactor systems. This replacement also makes possible the development of novel UV reactors with new applications.

UV-LED reactors may generally be used for irradiating fluids, with applications such as water disinfection. However, in a typical UV-LED reactor, there is considerable heating of the UV-LED (or other electronic devices) used in the reactor. Excessive heating of a UV-LED used in a UV-LED photoreactor may decrease radiation output, decrease the useful lifetime of the UV-LED and/or shift the peak wavelength of the emitted radiation. The radiation output of a UV-LED and/or its lifetime performance may significantly improve with appropriate thermal management (e.g. heat dissipation). The heat generated by UV-LEDS may adversely affect the performance of other electronic components electronically connected to the UV-LED (e.g. mounted on the same printed circuit board (PCB)) and/or vice versa.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

Aspects of the invention provides apparatus and methods for thermal management of the heat generated by UV-LEDs, which involve dissipation of the heat generated by UV-LEDs. Thermal management may enhance the UV-LED radiation output and/or the operational lifetime of the UV-LEDs. Particular embodiments provide apparatus and methods for providing heat dissipation for the UV-LEDs and/or other electronic devices used in UV-LED photoreactors for the irradiation of a fluid flow. By way of non-limiting example, the UV-LED reactor may be a fluid treatment reactor, such as a water treatment reactor.

In accordance with some aspects of the invention, a fluid flowing through fluid flow channels of a UV-LED photoreactor is used to dissipate heat generated by the UV-LEDs and/or other electronic devices of the photoreactor. The UV reactor is configured so that part of the irradiated fluid is circulated in the proximity of the UV-LEDs or the UV-LED circuit board, and/or by incorporating thermally conductive materials in the walls of the fluid conduit. Heat dissipation may be achieved by thermally coupling the highly thermally conductive material of a LED printed circuit board (PCB) on which one or more UV-LEDs are operatively connected to at least one fluid conduit-defining wall of the photoreactor. Such fluid conduit-defining wall(s) of the photoreactor may also be made of highly thermally conductive material. With this thermal coupling, heat generated by the UV-LEDs spreads through the highly heat conductive PCB and the at least one highly heat conductive conduit-defining wall(s) of the photoreactor, such that as the fluid flows in the conduit of the photoreactor, it dissipates the heat generated by the UV-LED(s) away from the UV-LED(s) through the conduit-defining wall(s) of the photoreactor. In this configuration, the PCB on which the UV-LEDs are connected can be connected to the fluid conduit either directly or through other thermally conductive parts of the reactor or through other thermally conductive materials from the side of the PCB on which the UV-LED(s) is connected. The thermal coupling may be achieved, in some embodiments, through regions (e.g. edges) of a metal-core PCB that do not have the typical soldering mask coating (or have this solder mask coating removed) and as a result are highly thermally conductive. This configuration may improve thermal management and, consequently, the radiation power output and lifetime of the UV-LED(s) and the corresponding UV-LED photoreactor.

One aspect of the invention provides an ultraviolet (UV) reactor for irradiating a flow of fluid with UV radiation. The reactor comprises: a fluid conduit defined by a heat conducting conduit body comprising one or more heat conducting walls for permitting a flow of fluid therethrough; and a UV light emitting diode (UV-LED) operatively connected to a printed circuit board (PCB), the UV-LED oriented for directing radiation into the fluid conduit. The PCB comprises a heat conducting substrate having a first surface. The heat conducting conduit body is in thermal contact with the first surface of the heat conducting substrate of the PCB. Heat is dissipated from the UV-LED via the heat conducting substrate, the thermal contact between the first surface of the heat conducting substrate and the heat conducting conduit body, and from the one or more heat conducting walls of the heat conducting conduit body to the fluid flowing through the fluid conduit.

The UV-LED may be oriented for directing radiation to have a principal optical axis extending in a first direction from the UV-LED to the fluid conduit. The first surface of the heat conducting substrate may be planar with a normal vector oriented substantially in the first direction. In some embodiments, the orientation of normal vector of the first surface being substantially in the first direction means that in any plane, the angular difference between normal vector and the first direction is less than 25°. In some embodiments, this angular difference is less than 15°. In some embodiments, this angular difference is less than 5°.

The thermal contact between the heat conducting conduit body and the first surface of the heat conducting substrate of the PCB may comprise a thermal contact enhancing component interposed between the heat conducting conduit body and the first surface of the heat conducting substrate. The thermal contact enhancing component may reduce a thermal contact resistance (increasing the thermal contact conductivity) between heat conducting conduit body and the heat conducting substrate of the PCB. The thermal contact enhancing component may comprise a thermally conductive and deformable thermal pad. The thermal contact enhancing component may comprise a thermally conductive gel or paste. The thermal contact between the heat conducting conduit body and the first surface of the heat conducting substrate of the PCB may comprise a heat conducting intermediate component interposed between the heat conducting conduit body and the first surface of the heat conducting substrate.

The PCB may comprise a thermal contact region where the first surface of the heat conducting substrate is exposed. the thermal contact between the heat conducting conduit body and the first surface of the heat conducting substrate may be made in the thermal contact region. A solder mask coating of the PCB is removed from the thermal contact region of the PCB. The PCB may comprise a solder mask covering the first surface of the heat conducting substrate in a circuit region adjacent to the thermal contact region, the UV-LED located in the circuit region.

The fluid flowing through the fluid conduit may contact the one or more heat conducting walls of the fluid conduit to dissipate heat from the one or more heat conducting walls of the fluid conduit into the fluid. The contact between the fluid flowing through the fluid conduit and the one or more heat conducting walls of the fluid conduit may occur, at least in part, inside a UV active region of the reactor.

The heat conducting conduit body may comprise: a plurality of fluid flow channels, each fluid flow channel defined by one or more heat conducting walls; and a manifold located at the ends of at least two of the plurality of fluid flow channels and shaped to provide fluid communication between the at least two fluid flow channels. The thermal contact between the heat conducting conduit body and the first surface of the heat conducting substrate may comprise thermal contact between the manifold and the first surface of the heat conducting substrate. The manifold may be integrally formed with the plurality of fluid flow channels. The manifold may be joined to, and in thermal contact with, the plurality of fluid flow channels.

The principal optical axis may be generally parallel with a direction of flow of the fluid through the fluid conduit. Where the heat conducting conduit body comprises a plurality of longitudinally extending fluid flow channels, the principal optical axis may be generally parallel with a longitudinal direction of fluid flow through the plurality of longitudinally extending fluid channels. The first direction in which the optical axis extends from the UV-LED to the fluid conduit may oppose the longitudinal direction of fluid flow in at least one of the plurality of fluid flow channels. The first direction in which the optical axis extends from the UV-LED to the fluid conduit may additionally or alternative be the same as the longitudinal direction of fluid flow in at least one of the plurality of fluid flow channels.

Another aspect of the invention provides a method for thermal management in an ultraviolet (UV) reactor for irradiating a flow of fluid with UV radiation. The method comprises: permitting a flow of fluid through a fluid conduit defined by a heat conducting conduit body comprising one or more heat conducting walls; operatively connecting a UV light emitting diode (UV-LED) to a printed circuit board (PCB), the PCB comprising a heat conducting substrate having a first surface; orienting the UV-LED for directing radiation into the fluid conduit; and making thermal contact between the heat conducting conduit body and the first surface of the heat conducting substrate of the PCB; wherein heat is dissipated from the UV-LED via the heat conducting substrate, the thermal contact between the first surface of the heat conducting substrate and the heat conducting conduit body, and from the one or more heat conducting walls of the heat conducting conduit body to the fluid flowing through the fluid conduit.

The method may comprise features similar to those of the reactors described herein and methods of fabricating, assembling, and/or using same.

In addition to the exemplary aspects and embodiments described above, further aspects and embodiments will become apparent by reference to the drawings and by study of the following detailed descriptions.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIG. 1A is a schematic perspective view of a UV-LED reactor according to an example embodiment of the present invention;

FIG. 1B is a schematic side cross-section view of the FIG. 1A UV-LED reactor;

FIG. 1C is a schematic front view of the UV-LEDs operatively connected to the PCB of the FIG. 1A UV-LED reactor;

DESCRIPTION

Figure 1D:
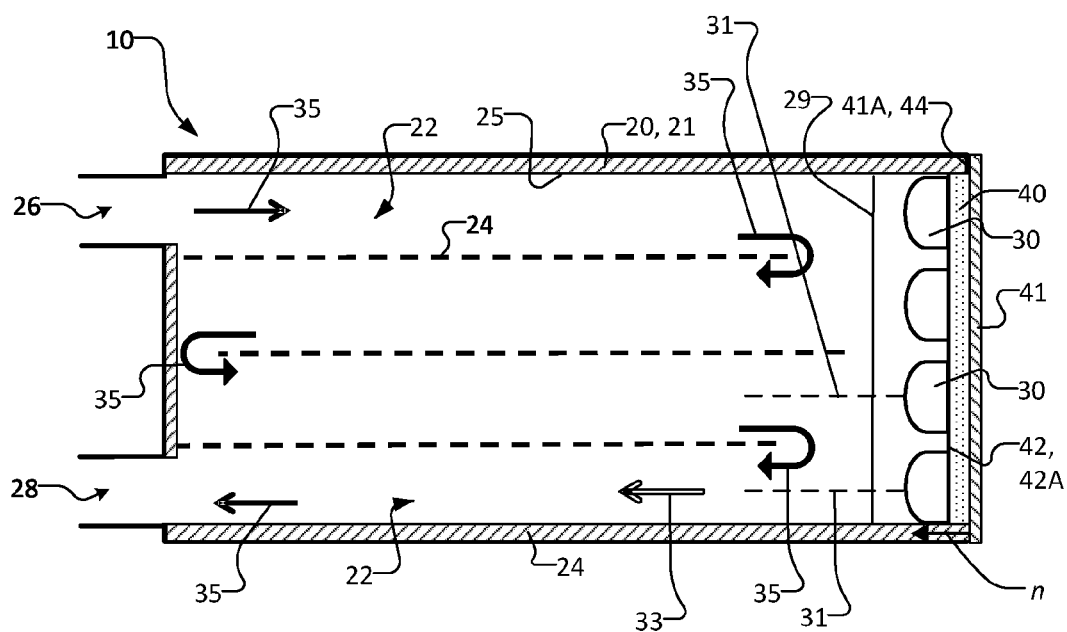
FIG. 1D is a schematic top cross-section view of the FIG. 1A UV-LED reactor.
Figure 1E:
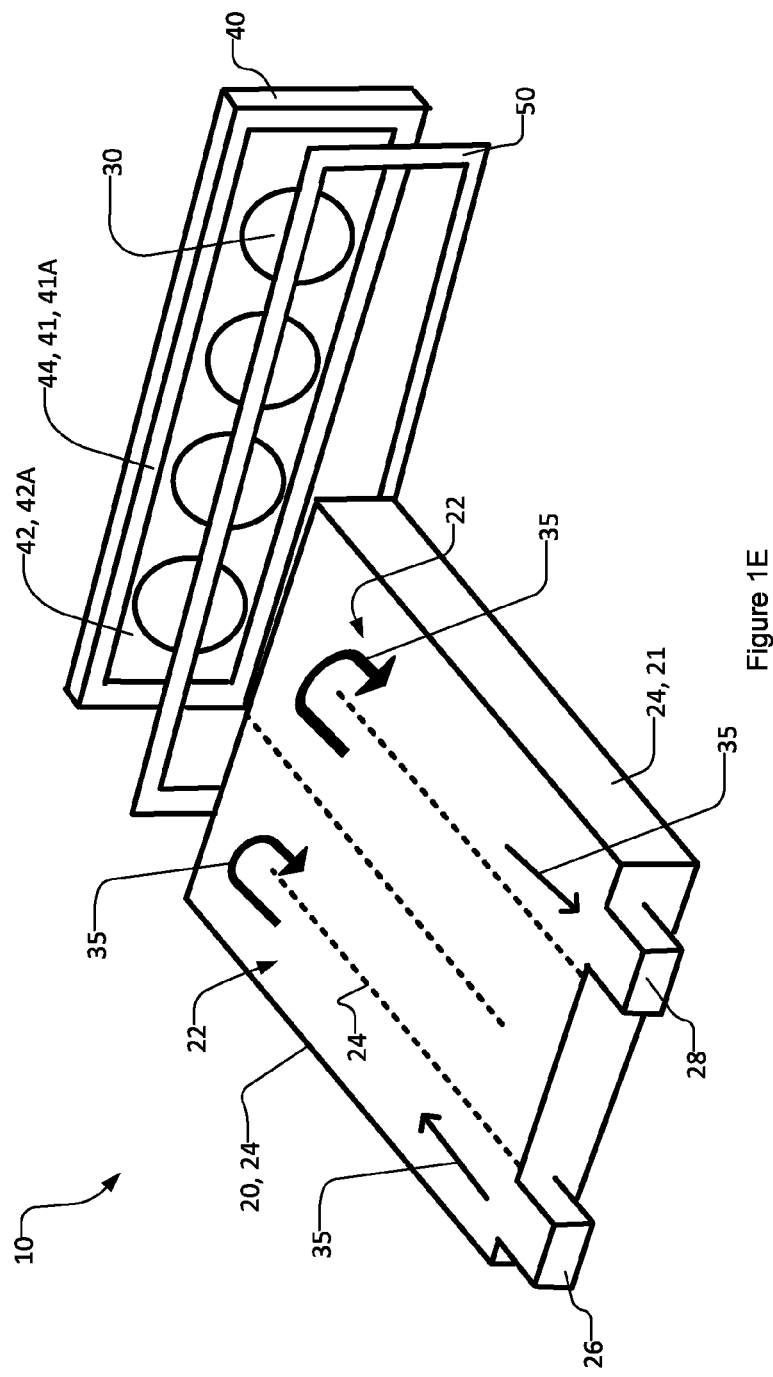
FIG. 1E is a schematic exploded perspective view of the FIG. 1A UV-LED reactor.

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Unless the context dictates otherwise, "fluid" (as used herein) refers to a liquid (including, but not limited to water) and/or a gas (including, but not limited to air).

Unless the context dictates otherwise, "ultraviolet" (as used herein) refers to electromagnetic radiation having a wavelength shorter than that of the violet end of the visible spectrum but longer than that of X-rays. Typically, ultraviolet refers to electromagnetic radiation with a wavelength from about 10 nm to about 400 nm.

This application makes use of the phrase "thermal contact". Unless the context dictates otherwise, thermal contact should be understood to comprise physical contact between two or more thermally conductive components, such as physical contact between metals or between components having thermal conductivities on the order of those of metals. For example, in some embodiments, materials having thermal conductivities on the order of those of metals and capable of making "thermal contact" may comprise materials having thermal conductivities of at least 60% of the thermal conductivity of typical stainless steel at room temperature and pressure. In some embodiments, such materials have thermal conductivities of greater than 10 W/(mK) at room temperature and pressure. In some embodiments, such materials have thermal conductivities of greater than 12 W/(mK) at room temperature and pressure. In some circumstances, thermal contact between components may be enhanced by thermal contact enhancing components. Such thermal contact enhancing components may comprise pastes, gels, deformable solids and/or the like which enhance the thermal conductivity between two or more components in thermal contact.

This application describes materials and components as being "thermally conductive" or "heat conducting". Unless the context dictates otherwise, these phrases should be understood to refer to materials and components that have thermal conductivities on the order of those of metals. For example, in some embodiments, materials and/or components having thermal conductivities on the order of those of metals and described as being "thermally conductive" or "heat conducting" may comprise materials having thermal conductivities of at least 60% of the thermal conductivity of typical stainless steel at room temperature and pressure. In some embodiments, such materials have thermal conductivities of greater than 10 W/(mK) at room temperature and pressure. In some embodiments, such materials have thermal conductivities of greater than 12 W/(mK) at room temperature and pressure.

The present technology is directed to a reactor (photoreactor) operating with one or more solid-state ultraviolet (UV) emitters (e.g. UV light (radiation) emitting diodes (UV-LEDs), thin dielectric films that emit UV, and/or the like), to cause photoreactions in a fluid. One or more photocatalyst structures, activated by UV, may be used in the photoreactor for photocatalytic reactions. Chemical oxidants may also be added to the reactor to react with the UV radiation and generate highly active radicals such as hydroxyl radicals for photo-initiated oxidation reactions. Embodiments of the UV-LED reactors described herein may be efficient and compact, with integrated components, and may offer precise control of both their fluidic and optical environments. The UV-LED reactors comprise one or more specifically designed flow channels and at least one UV-LED configured for irradiating the fluid flowing through the flow channels.

Embodiments of the UV-LED reactor may be used for water purification by inactivating microorganisms (e.g. bacteria and viruses) and/or degrading micro-pollutants such as chemical contaminants (e.g. toxic organic compounds) by direct photoreaction and/or photocatalytic reactions and/or photo-initiated oxidation. The fluid (e.g. water) flows through the UV-LED reactor by forced convection, using, for example, electrical pumps. The UV-LED(s) may be powered by wall plug, solar cells, or battery. The UV-LED(s) may be turned on and off automatically as the water flows or stops flowing. A photocatalyst such as titanium dioxide or other suitable photocatalyst may be immobilized on a solid substrate (where the fluid passes over the substrate) or on a perforated substrate (where the fluid passes through the substrate). In some embodiments, a combination of photocatalystics, catalyst supports, and/or co-catalysts may be disposed in the substrate in the fluid flow channel. If applicable, chemical oxidants may be injected into the reactor. The chemical oxidant may be hydrogen peroxide or ozone or other chemicals. If applicable, chemical reducing agents may be injected into the reactor.

Reactors that operate with one or more UV-LEDs as a source of UV radiation have advantages over traditional mercury UV lamps, including, without limitation, their compact and robust design, lower voltage and power requirements, and the ability to turn on and off with high frequency. Unlike UV lamps, UV-LEDs are radiation sources with individual, small sizes. They may be positioned in a reactor with a higher degree of freedom compared to the arrangement of traditional mercury UV lamps. Further, the performance of UV-LED reactors may be improved with optimizations to the reactor geometry as described herein. In particular, embodiments of the UV-LED reactor described herein may be optimized to dissipate heat away from the one or more UV-LEDs (and/or electronic devices of the UV-LED reactor), thereby facilitating improved radiation output and useful lifetime of the UV-LEDs.

To increase or maintain the lifespan of the UV-LEDs, the fluid flowing through and being irradiated by the UV-LED reactor may be used for the thermal management of the UV-LEDs by transferring heat generated by the UV-LEDs to the irradiated fluid and thereby dissipating heat from the UV-LEDs via the fluid being treated. The UV-LED reactor may be configured so that part of the irradiated fluid is circulated in the proximity of the UV-LEDs or the UV-LED circuit board, and/or by incorporating thermally conductive material in the walls of the fluid conduit of the reactor.

FIGS. 1A-1E show a UV-LED reactor 10 according to an exemplary embodiment of the present invention. UV-LED reactor 10 comprises a fluid conduit 20 defined by a heat conducting conduit body 21, at least one UV-LED 30 operatively connected to a printed circuit board (PCB) 40 and oriented for directing radiation into fluid conduit 20. More specifically, UV-LEDs 30 are oriented to direct radiation into fluid conduit 20 by having a principal optical axis 31 that extends from UV LEDs 30 toward the fluid in conduit 20 along a first direction 33. Heat conducting conduit body 21 comprises one or more heat conducting channel walls 24 which in turn define fluid flow channels 22 in reactor 10. An inlet 26 and an outlet 28 are respectively provided for fluid (e.g. water) to enter and exit fluid conduit 20. The main fluid flow directions are shown in FIGS. 1A and 1D by arrows 35, which illustrate that the fluid flow enters reactor 10 from inlet 26, flows through longitudinally extending flow channels 22 and turns at the ends of adjacent interior flow channels 22, and exits from outlet 28. A UV-transparent window 29, such as a quartz or silica glass window, may be embedded in heat conducting body 21, between UV-LEDs 30 and flow channels 22. As will be appreciated by those skilled in the art, UV-LED reactor 10 may comprise driver circuits (e.g. LED drivers 32 shown in FIG. 2), microcontrollers, a power port, an on/off switch, and/or the like for UV-LEDs 30. To avoid obscuring the drawing, none of these common components are shown in FIGS. 1A-1E. One or more lenses, including collimating, converging, and/or other lenses (not shown), or a combination thereof, may be disposed in UV-LED reactor 10 between UV-LEDs 30 and fluid flow channels 22 to focus the UV-LED radiation pattern into longitudinally extending fluid flow channels 22 along principal optical axes 31 corresponding to each UV-LED 30.

PCB 40 comprises a heat conducting substrate 41 having a first surface 41A. First surface 41A of heat conducting substrate 41 is generally planar and has a normal vector n. As shown in FIG. 1B, normal vector n may be oriented substantially in the first direction 33 (i.e. in the direction which radiation is directed from UV-LED 30 into fluid conduit 20). In some embodiments, the orientation of normal vector n of first surface 41A being substantially in the first direction 33 means that in any plane, the angular difference between normal vector n and first direction 33 is less than 25°. In some embodiments, this angular difference is less than 15°. In some embodiments, this angular difference is less than 5°. Heat conducting conduit body 21 is in thermal contact with first surface 41A of heat conducting substrate 41 of PCB 40. In this manner, heat is dissipated from UV-LED 30 via heat conducting substrate 41, the thermal contact between first surface 41A of heat conducting substrate 41 and the heat conducting conduit body 21, and from the one or more heat conducting walls 24 of heat conducting conduit body 21 to the fluid flowing through fluid conduit 20.

Referring to UV-LED reactor in FIGS. 1A-1E, reactor 10 comprises an array of longitudinally extending fluid flow channels 22, each such flow channel 22 irradiated by one corresponding UV-LED 30 optionally through a corresponding radiation-focusing element (not shown) and, in the illustrated embodiment, through UV transparent window 29. In other embodiments, each flow channel 22 may be irradiated by more than one corresponding UV-LED and a plurality of radiation-focusing elements may be incorporated (one or more radiation focusing elements for each UV-LED 30 and/or one or more radiation focusing elements shared between UV LEDs 30) to focus the radiation from each UV-LED 30. The corresponding UV-LEDs 30 and/or the corresponding radiation-focusing elements may be positioned at longitudinal ends of their corresponding longitudinally-extending flow channel 22. Reactor 10 may comprise several UV-LEDs 30 that are oriented to direct radiation into one corresponding flow channel 22 (i.e. a many to one LED to flow channel ratio). Reactor 10 may comprise several UV-LEDs 30 that emit different UV wavelengths. This may result in a synergistic effect and increase the rate of photoreactions and photocatalytic reactions. Adjacent pairs of fluid flow channels 22 may be connected at one end, for example through a manifold (such as manifold 160 shown in FIG. 2) or some other suitable port, to enable the fluid to flow in a serpentine path from one longitudinally extending channel 22 to another longitudinally extending channel 22. As can be seen from the exemplary embodiment shown in FIGS. 1A-1E, fluid travels through multiple longitudinally extending channels 22 and makes multiple passes as the fluid travels through UV-LED reactor 10 between inlet 26 and outlet 28.

Referring to UV-LED reactor 10 in FIGS. 1A-1E, the fluid flows in and out of UV-LED reactor 10, passing through longitudinally extending flow channels 22, and is irradiated by UV radiation from UV-LEDs 30. In the illustrated embodiment, UV-LEDs 30 are positioned at one end of fluid conduit 20 and each longitudinally extending fluid flow channel 22. The principal optical axes 31 of the radiation from UV-LEDs 30 (after optionally being focused by the lenses discussed above) extends in first directions 33. These first directions 33 may be generally parallel with the longitudinal direction of fluid flow in longitudinally extending channels 22 and may be generally parallel to the longitudinal extension of the longitudinally extending flow channels 22. FIGS. 1A-1E show the illustrated flow channels 22 of fluid conduit 20 being irradiated from one end of reactor 10. In general, the fluid conduit flow channels of a UV-LED reactor may be irradiated from either or both longitudinal ends of the flow channels. In some embodiments, UV-LEDs may be located on opposing longitudinal ends of the UV-LED reactor, so that the principal optical axes of radiation from longitudinally opposing UV-LEDs may be in opposing but parallel longitudinal directions.

The fluid flowing through, and being irradiated by, UV-LED(s) 30 may be used to dissipate the heat generated by UV-LED(s) 30 and/or other heat producing electronic devices (not shown) of reactor 10 away from UV-LED(s) 30 (and/or the other electronic devices). In the exemplary embodiment shown in FIGS. 1A-1E, reactor 10 is configured so that the irradiated fluid is circulated in the proximity of UV-LEDs 30 and PCB 40. Reactor 10 also incorporates a thermally conductive material (heat conducting) conduit body 21 comprising heat conducting channel walls 24 to dissipate heat away from UV-LEDs and PCB 40. Specifically, heat conducting conduit body 21 is in thermal contact with first surface 41A of heat conducting substrate 41 of PCB 40. In this manner, heat is dissipated from UV-LED 30 via heat conducting substrate 41, the thermal contact between first surface 41A of heat conducting substrate 41 and the heat conducting conduit body 21, and from the one or more heat conducting walls 24 of heat conducting conduit body 21 to the fluid flowing through fluid conduit 20. Heat exchange occurs inside the UV active region of UV-LED reactor 10 (i.e. in the region of reactor 10 irradiated by UV radiation from UV-LED(s) 30).

In some embodiments, reactor 10 may optionally comprise a thermal contact enhancing component 50 (shown in FIG. 1E) which may be interposed in the thermal contact between heat conducting conduit body 21 and first surface 41A of heat conducting substrate 41 of PCB 40. Thermal contact enhancing component 50 comprises a thermally conductive material, including but not limited to paraffin wax and/or a silicone-based material. In some embodiments, thermal contact enhancing component 50 is deformable (e.g. a deformable pad or deformable gel or paste) to fill small irregularities in the physical contact between heat conducting conduit body 21 and first surface 41A. When interposed between heat conducting conduit body 21 and first surface 41A, thermal contact enhancing component 50 may reduce the thermal contact resistance (increase the thermal contact conductivity) between heat conducting conduit body 21 and first surface 41A. Thermal contact enhancing component 50 is optional and is not necessary in all embodiments.

UV-LEDs 30 are operatively connected to PCB 40 in a circuit region 42. In circuit region 42, PCB may be covered (at least for the most part) by a solder mask coating 42A in circuit region 42. To facilitate thermal contact between heat conducting conduit body 21 and first surface 41A of heat conducting substrate 41 of PCB 40, in some embodiments, an exposed thermal contact region 44 is provided on first surface 41A. Thermal contact region 44 may be the portion of first surface 41A that is in thermal contact with heat conducting conduit body 21. Solder mask coating 42A may be removed from first surface 41A of head conducting PCB substrate 41 in thermal contact region 44. For example, as best seen in FIG. 1C, thermal contact region 44 (e.g. which is devoid from solder mask 42) may be located around the edges of PCB 40, although thermal contact region 44 may be located at some other suitable region of PCB 40, with no electronic components attached thereto and with no electrical connections). Solder mask coating 42 of PCB 40 may be removed, by way of non-limiting example, by laser-cutting, etching and/or the like to provide thermal contact between heat conducting conduit body 21 and first surface 41A of heat conducting substrate 41 of PCB 40 to facilitate heat transfer between LEDs 30, PCB 40, channel wall(s) 24 and the fluid flowing in reactor 10. The widths of thermal contact region 44 at the edge of PCB 40 could be several millimeters, in some embodiments. Generally, the larger the dimensions of thermal contact region 44, the higher the rate of heat transfer. However, there is a trade-off since increasing the dimensions of thermal contact region 44 can increase the size of the entire reactor 10. Removing outer layers (e.g. solder mask 42) to expose heat conducting substrate layer 41 of PCB 40 yields a significant improvement in the thermal contact/coupling between PCB 40 and heat conductive channel wall(s) 24 of fluid conduit 20, so heat from UV-LEDs 30 can be transferred to the fluid travelling through flow channels 22 (e.g. because of the large surface area of channel wall(s) 24 which define fluid flow channels 22, because of the nature of the moving fluid within channels 22, and because of the temperature of the fluid inside flow channels 22, which is typically lower than that of PCB 40).

Figure 2:
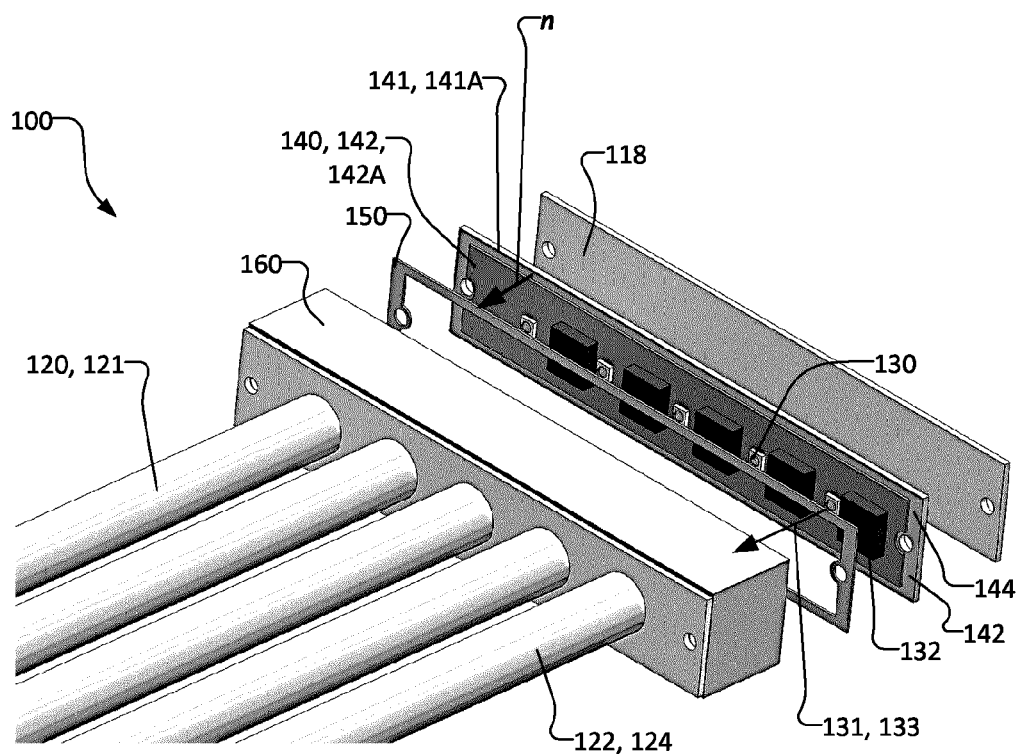
FIG. 2 is a perspective view of part of a UV-LED reactor according to an example embodiment of the present invention.

FIG. 2 shows a partial perspective view of a UV-LED reactor 100 according to an exemplary embodiment of the present invention. Many features and components of reactor 100 are similar to feature and components of reactor 10, with the same reference numerals preceded by the digit "1" being used to indicate features and component of reactor 100 that are similar to those of reactor 10. However, UV-LED reactor 100 differs from UV-LED reactor 10 in that heat conducting conduit body 121 of UV-LED reactor 100 comprises a heat conducting manifold 160 that directs fluid flow between flow channels 122 at one longitudinal end to permit a fluid to flow from one longitudinally extending flow channel 122 to another longitudinally extending flow channel 122, as discussed above in connection with FIGS. 1A-1E. Although not shown in FIG. 2, reactor 100 may have another manifold 160 at its opposing longitudinal end. Heat conducting manifold 160 may be integrally formed with heat conducting channel walls 124 of conduit body 121 or may be joined to an in thermal contact with heat conducting walls 124 of conduit body 121.

Like reactor 10 described above, UV-LED reactor 100 comprises a fluid conduit 120 defined by a heat conducting conduit body 121, at least one UV-LED 130 operatively connected to a printed circuit board (PCB) 140 and oriented for directing radiation into fluid conduit 120. More specifically, UV-LEDs 130 are oriented to direct radiation into fluid conduit 120 by having a principal optical axis 131 that extends from UV LEDs 130 toward the fluid in conduit 120 along a first direction 133. Heat conducting conduit body 121 comprises one or more heat conducting channel walls 124 which in turn define fluid flow channels 122 in reactor 110. PCB 140 comprises a heat conducting substrate 141 having a first surface 141A. First surface 141A of heat conducting substrate 141 is generally planar and has a normal vector n. As shown in FIG. 2, normal vector n may be oriented substantially in the first direction 133 (i.e. in the direction which radiation is directed from UV-LEDs 130 into fluid conduit 120). In some embodiments, the orientation of normal vector n of first surface 141A being substantially in the first direction 133 means that in any plane, the angular difference between normal vector n and first direction 133 is less than 25°. In some embodiments, this angular difference is less than 15°. In some embodiments, this angular difference is less than 5°. Heat conducting conduit body 121 is in thermal contact with first surface 141A of heat conducting substrate 141 of PCB 140. In this manner, heat is dissipated from UV-LED 130 via heat conducting substrate 141, the thermal contact between first surface 141A of heat conducting substrate 141 and the heat conducting conduit body 121 (via manifold 160), and from the one or more heat conducting walls 124 of heat conducting conduit body 121 to the fluid flowing through fluid conduit 120.

Like reactor 10 described above, reactor 100 may comprise a thermal contact enhancing component 150 having features similar to those of thermal contact enhancing component 150 described above, except that thermal contact enhancing component 150 is interposed between manifold 160 and first surface 141A (at thermal contact region 144) of heat conducting substrate 141 of PCB 140. Reactor 100 of the illustrated FIG. 2 embodiment also comprises a pressure plate 118 (e.g. fabricated from a rigid material including, but not limited to stainless steel) which may be coupled to manifold 160 by suitable fasteners (not shown) to hold manifold 160 of heat conducting body 121 and first surface 141 of PCB 140 in thermal contact with each other, thereby minimizing air gaps and enhancing thermal conductivity.

Like reactor 10 described above, PCB 140 may comprise a circuit region 142 on which LED 130 are located and circuit region 142 may be covered with solder mask 142A. Like reactor 10 described above, solder mask 142A may be removed from surface 141A of heat conducting substrate 141 in thermal contact region 144 or thermal contact region 144 may otherwise be devoid of solder mask 142A. FIG. 2 shows UV-LED driver circuitry 132, which, in the illustrated embodiment, is located on the same PCB 140 as LEDs 130. This is not necessary and UV-LED driver circuitry 132 may be located in other locations if space becomes a design limitation.

While only one longitudinal end of reactor 100 is shown in FIG. 2, the same concept can be applied to the other longitudinal end of flow channels 122. That is, the fluid in flow channels 122 may be irradiated by UV-LEDs from the other longitudinal end and the heat generated by such UV-LEDs (and/or other electronic components of reactor 100) may be removed by the same way described herein for one longitudinal end.

Figure 3A:
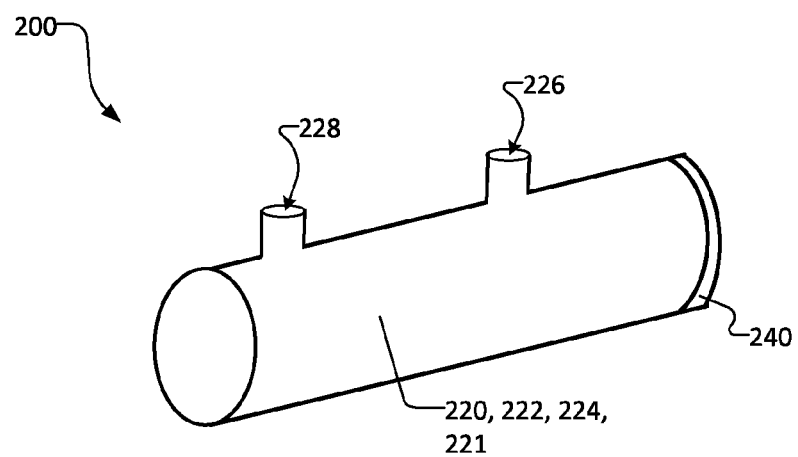
FIG. 3A is a schematic perspective view of a UV-LED reactor according to an example embodiment of the present invention.
Figure 3B:
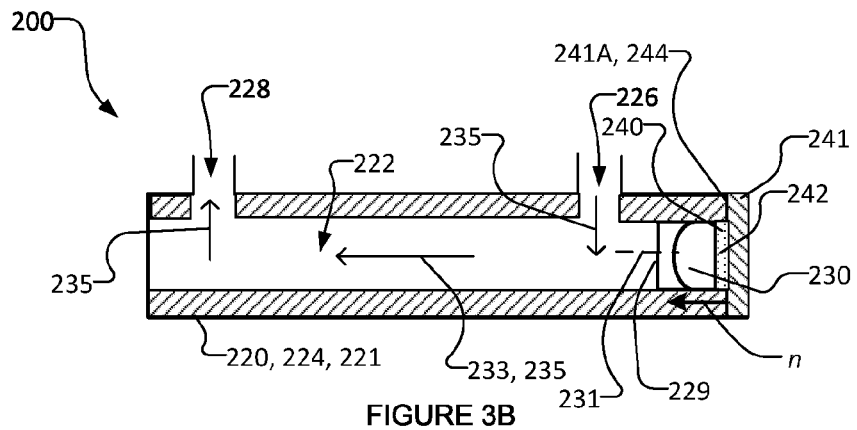
FIG. 3B is a schematic side view of the FIG. 3A UV-LED reactor.

In the exemplary embodiments shown in FIGS. 1A-1E and FIG. 2, the UV-LED reactors comprise a series of longitudinally extending flow channels through which fluid flows in corresponding longitudinal directions, which is irradiated, either with one UV-LED, or with an array of UV-LEDs. In a multi-channel reactor, such as the FIGS. 1A-1E and FIG. 2 embodiments, the fluid flow may go through the channels in parallel or in series (fluid flow going from one channel to another, where the flow channels are in fluid communication at their ends). In the exemplary embodiment shown in FIGS. 3A-3B, UV-LED reactor 200 comprises a fluid conduit 220 defined by a heat conducting conduit body 221 comprising a single longitudinally extending fluid flow channel 222 through which fluid flows in a corresponding longitudinal direction, which is irradiated with one or more UV-LEDs 230. The main fluid flow directions are shown in FIGS. 3A-3B by arrows 235, showing fluid entering UV-LED reactor 200 from inlet 226, flowing through longitudinally extending flow channel 222, and exiting from outlet 228. The UV-LED radiation is focused via a focusing element (not shown here), such as one or more converging and collimating lenses. The fluid flowing in the longitudinal direction in the reactor channel 222 is irradiated by the focused radiation from the UV-LED(s) 230 in the longitudinal directions of channel 222. The UV-LED(s) 230 may be positioned at one or both ends of flow channel 122. The total UV dose (UV fluence) delivered to the fluid may be controlled by adjusting the fluid flow rate and/or regulating UV-LED radiant power, and/or turning on/off the number of UV-LEDs. Many features and components of reactor 200 are similar to feature and components of reactor 10, with the same reference numerals preceded by the digit "2" being used to indicate features and component of reactor 200 that are similar to those of reactor 10.

Figure 4:
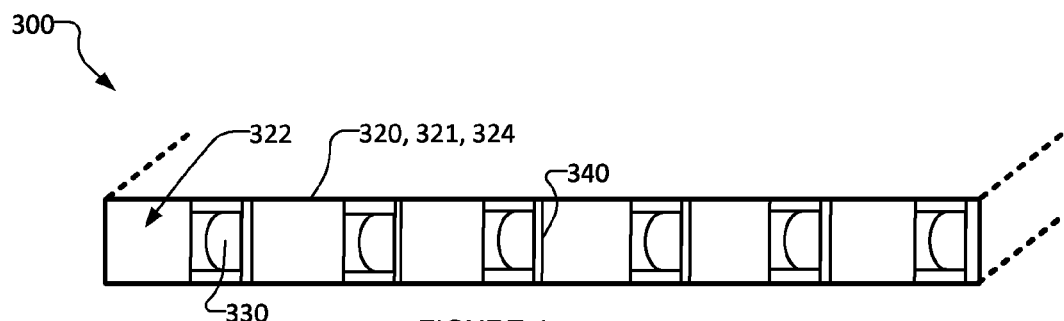
FIG. 4 is a schematic top view of a UV-LED reactor according to an example embodiment of the present invention.

In the exemplary embodiments shown in FIGS. 1A-1E and FIG. 2, the UV-LED reactors comprise a series of longitudinally extending flow channels through which fluid flows in corresponding longitudinal directions, which is irradiated at one end with one UV-LED, or with an array of UV-LEDs. In a multi-channel reactor, such as the FIGS. 1A-1E and FIG. 2 embodiments, the main directions of the radiation from UV-LEDs 30 (after optionally being focused by the lenses discussed above) and of the fluid flow in longitudinally extending channels 22 are along longitudinal directions generally parallel to the longitudinal extension of the longitudinally extending flow channels 22. In some embodiments, UV-LEDs may additionally or alternatively be positioned along flow channels so that the radiation from the UV-LEDs is generally orthogonal to the longitudinal extension of the longitudinally extending flow channels and the main fluid flow direction of fluid in the flow channels. For example, FIG. 4 shows a top cross section view of a UV-LED reactor 300 according to an exemplary embodiment of the present invention. Many features and components of reactor 300 are similar to feature and components of reactor 10, with the same reference numerals preceded by the digit "3" being used to indicate features and component of reactor 300 that are similar to those of reactor 10.

As can be seen from the exemplary embodiment shown in FIG. 4, fluid travels through multiple longitudinally extending channels 322 (defined by heat conducting conduit body 321 and its heat conducting walls 324) and makes multiple passes as the fluid travels through UV-LED reactor 300 between an inlet and an outlet (not shown here). The fluid flowing through channels 322 and being irradiated by UV-LEDs 330 may be used to dissipate the heat generated by UV-LEDs 330 and/or other heat producing electronic devices (not shown) of reactor 300 away from UV-LEDs 330 (and/or the other electronic devices). In the exemplary embodiment shown in FIG. 4, reactor 300 is configured so that the irradiated fluid is circulated in the UV active region of UV-LEDs 330. More specifically, UV-LEDs 330 are oriented to direct radiation into fluid conduit 320 by having a principal optical axis that extends from UV LEDs 330 toward the fluid in conduit 320 along a first direction. Heat conducting conduit body 321 comprises one or more heat conducting channel walls 324 which in turn define fluid flow channels 322 in reactor 310. PCB 340 comprises a heat conducting substrate having a first surface. The first surface of the heat conducting substrate is generally planar and has a normal vector n which may be oriented substantially in the first direction (i.e. in the first direction which radiation is directed from UV-LEDs 330 into fluid conduit 320). The meaning of substantially in the first direction may have the meaning described elsewhere herein. Heat conducting conduit body 321 is in thermal contact with the first surface of the heat conducting substrate of PCB 340. In this manner, heat is dissipated from UV-LED 330 via the heat conducting substrate, the thermal contact between the first surface of the heat conducting substrate and the heat conducting conduit body 321, and from the one or more heat conducting walls 324 of heat conducting conduit body 321 to the fluid flowing through fluid conduit 320. Reactor 300 shown in FIG. 4 may comprise other characteristics and components similar to the reactors 10, 110 described above.

Figure 5:
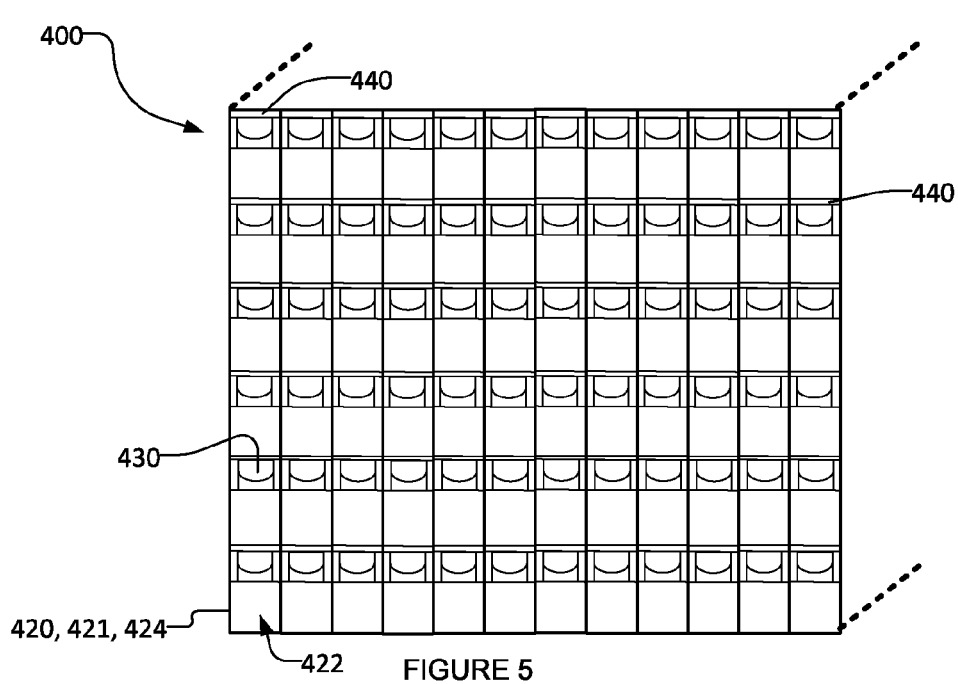
FIG. 5 is a schematic top view of a UV-LED reactor according to an example embodiment of the present invention.

FIG. 5 shows a top cross section view of a UV-LED reactor 400 according to an exemplary embodiment of the present invention. UV-LED Reactor 400 comprises a series of longitudinally stacked reactors 300. Fluid travels through UV-LED reactor 400 between an inlet and an outlet (not shown here) as described above in relation to FIG. 4. The thermal management technique employed by reactor 400 is similar to the thermal management technique described above in relation to FIG. 4. Many features and components of reactor 400 are similar to feature and components of reactor 10, with the same reference numerals preceded by the digit "4" being used to indicate features and component of reactor 400 that are similar to those of reactor 10.

Figure 6:
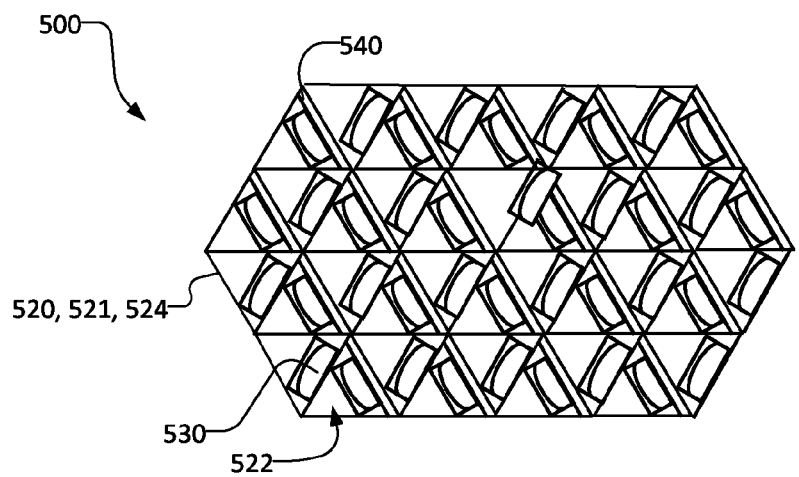
FIG. 6 is a schematic top view of a UV-LED reactor according to an example embodiment of the present invention.

The longitudinally extending fluid flow channels described herein have a cross section which may take any suitable shape, including, without limitation, a circle, a semi-circle, a square, a rectangle, a triangle, a trapezoid, a hexagon, and the like. These cross sections may enhance the reactor performance by improving thermal management. For example, a fluid flow channel having a circular cross section may provide optimal thermal management to the UV-LEDs (and/or other electronic devices) of the reactor. In the exemplary embodiment shown in FIG. 6, UV-LED reactor 500 comprises longitudinally extending fluid flow channels 522 having triangular cross section. Fluid travels through UV-LED reactor 500 between an inlet and an outlet (not shown here) as described above in relation to FIG. 4. The thermal management technique employed by reactor 500 is similar to the thermal management technique described above in relation to FIG. 4. Many features and components of reactor 500 are similar to feature and components of reactor 10, with the same reference numerals preceded by the digit "5" being used to indicate features and component of reactor 500 that are similar to those of reactor 10.

The thermal management techniques described herein takes advantage of fluid (typically water) to dissipate heat from electronics, including UV-LEDs, connected on a PCB. This is accomplished by maximizing the thermal contact between a heat conducting substrate of the PCB and the fluid conduit heat conducting walls, which are cooled continuously with fluid moving in the flow channels (and/or manifold). The thermal contact resistance of the thermal contact between the heat conducting conduit body and the heat conducting substrate of the PCB may be reduced significantly by interposing deformable and thermally conducting thermal contact enhancing components (e.g. thermal contact component 50, 150) between the heat conducting conduit body and the first surface of the heat conducting substrate of the PCB to fill the thermal gaps and/or by removing the solder mask coating from the edges (or other region(s)) of the PCB, as described elsewhere herein. Such thermal contact enhancing components are optional.

Other techniques of active or passive heat removal and thermal management, such as the use of a heat sink(s) or passing a fluid flow at the back of the PCB (i.e. the side opposite that on which the UV-LEDs are connected) may also be used in combination with the heat dissipation apparatus and methods described herein.

Some embodiments of a UV-LED reactor (not shown here) comprise a plurality of UV-LEDs irradiating the fluid through a longitudinally extending fluid flow channel. In some embodiments (not shown here), a plurality of radiation-focusing elements is incorporated (one for each UV-LED), and the radiation from each UV-LED is focused by its corresponding focusing element. In some embodiments, groups of one or more LEDs may share groups of one or more corresponding focusing elements (or one or more corresponding lenses from within one or more corresponding focusing elements) in any suitable matter. For example, there may be a total of 9 LEDs and 3 lenses, where the LEDs are grouped into three groups of 3 LEDs, and the radiation from each group of 3 LEDs passes through a single lens corresponding to the LED group. A UV-LED reactor incorporating multiple UV-LEDs may be particularly suitable for fluid flow channels which have a bore having relatively large cross-section. The multiple UV-LEDs may help to maximize irradiance coverage by increasing irradiance in such fluid flow channels, as compared to an embodiment operated with a single UV-LED for irradiating the fluid flow channel.

The UV-LED reactor of the present invention may be used for many photoreactions, photocatalytic reactors, and photo-initiated reactions. One particular application is the purification of water or purification of other UV-transparent fluids. Water treatment may be achieved by the inactivation of microorganisms (e.g. bacteria and viruses) and the degradation of micro-pollutants, such as chemical contaminants (e.g. toxic organic compounds), by direct photoreactions, photocatalytic reactions, and/or photo-initiated oxidation reactions. Water may flow through the UV-LED reactor by the use of a fluid-moving device, such as an electrical pump. The UV-LEDs may be powered by a wall plug, solar cells, or a battery. If applicable, a photocatalyst may be immobilized on a solid substrate, where the fluid passes over, and/or on a perforated substrate where the fluid passes through, including for example a mesh, screen, metal foam, cloth or combination thereof. The photocatalysts that are supported on the solid and/or perforated substrates may be positioned in the longitudinally extending fluid flow channels. The photocatalyst may also be positioned in the cross section of the fluid flow channel, to cover the cross section partially or entirely. If the photocatalyst covers the entire cross section of the flow channel, a perforated substrate may be used to allow for the fluid to pass through the photocatalyst substrate. The photocatalyst is irradiated with focused UV radiation from UV-LED, providing a UV-LED photocatalytic reactor. The photocatalyst may comprise titanium dioxide, or any other photocatalyst. In certain embodiments, a combination of one or more photocatalysts, catalyst supports and co-catalysts are provided on the solid and/or perforated substrate(s). If applicable, chemical reagents, such as chemical oxidants may be injected in the UV reactor. The chemical oxidant may comprise hydrogen peroxide, ozone, or other chemicals. The UV-LED may be turned on and off automatically by an external signal. The reactor may contain one or more components to restrain the fluid flow in the conduit, such as static mixers, vortex generators, baffles, and/or the like.

In some embodiments, static mixers, vortex generators, baffles, or the like may be deployed in the longitudinally extending fluid flow channels to increase mixing and/or to rotate the fluid flow as it goes through the fluid flow channels. This may enhance the UV-LED reactor performance by delivering a more uniform UV dose or by improving mass transfer near the photocatalyst surface where photocatalysts are present in the reactor. The static mixers, vortex generators, baffles, or the like may also serve as flow-restraining elements which may be adjusted dynamically to accommodate various incoming flow regimes to match the UV radiation fluence rate profile in the fluid flow channel.

The heat conducting conduit body of the embodiments of the UV-LED reactors described herein may be made of aluminum, stainless steel, or of any other sufficient and strong material, such as metal, alloy, high-strength plastic, or the like. The internal walls of the fluid conduit, which define the fluid flow channels, may (but need not necessarily) be made of or be coated with material with high UV reflectivity to reflect to the fluid any part of the radiation that is incident on the internal walls.

While the embodiments described herein are presented with particular features and fluid flow channel configurations or lens configurations and the like, it is to be understood that any other suitable combination of the features or configurations described herein may be present in a UV-LED reactor.

Further, the UV-LED reactor may incorporate UV-LEDs of different peak wavelengths to cause synergistic effects to enhance the photoreaction efficiency.

In some embodiments, the UV-LED reactor comprises a planar flow channel covered with a quartz or a silica glass window, which is irradiated with an array of UV-LEDs. This configuration may have two distinct forms:

a. The fluid flowing in the channel(s) (including parallel channels) is irradiated by UV-LEDs mainly in a direction that is perpendicular to the axis of the flow channel length (or main flow direction). In this case, the LED(s) are positioned along the length of the flow channel(s). The flow is mainly moving under/over UV-LEDs and is irradiated.

b. The fluid flowing in the channel(s) is irradiated by UV-LEDs mainly in a direction that is parallel to the axis of the flow channel length (or main flow direction). In this case, the LED(s) are positioned at one end or both ends of the flow channel(s). The flow is mainly moving towards or away from UV-LEDs and is irradiated.

In either of these configurations, the exposure of fluid to UV radiation may be controlled. The flow channels and UV-LED arrays can be arranged in a way that the flow is exposed to the desired number of LEDs. The design may be a single flow channel, a series of parallel flow channels, or a stack of multiple flow channels. The total UV dose delivered to a fluid may be controlled by adjusting the flow rate and/or regulating UV-LED power, and/or turning on/off the number of UV-LEDs. This design enables the manufacture of thin planar UV-LED reactors. For example, in some embodiments the UV-LD reactor may be approximately the size of a smart phone, in terms of geometry and dimensions, with inlet and outlet ports for a fluid.

In some embodiments, a plurality of LED(s) are positioned along the length of a longitudinally extending fluid flow channel so that the main direction of irradiation is perpendicular to the main direction of the flow. The LED(s) may be positioned along one side or along opposite sides of a longitudinally extending fluid flow channel. The flow may mainly move under (or over) the UV-LEDs and may be irradiated as it travels in longitudinal directions through the longitudinally extending fluid flow channel. The internal wall of the channels may be made of or be coated with material with high UV reflectivity for facilitating radiation transfer to the fluid. Two adjacent fluid flow channels may be connected at one end, for the fluid to go from one channel to another channel (fluid experiences multi-pass through the reactor). Different lenses including collimating, diverging, converging, and other lenses may be installed in the UV-LED reactor to adjust the UV-LED radiation pattern.

Particular applications of the UV-LED reactor include processing and treating water of low to moderate flow rates, for example, in point-of-use applications. Further, due to its compact configuration and high efficiency, the UV-LED reactor in accordance with the embodiments described herein may be incorporated in appliances (e.g. refrigerators, freezers, water coolers, coffee machines, water dispensers, icemakers, etc.), health care or medical devices or facilities, dental equipment, and any other devices which require the use of clean water. The UV-LED reactor may be either incorporated into the device or be applied as an add-on into the existing device. For example, the UV-LED reactor may be positioned somewhere through the waterline so that the UV-LED reactor treats the water that is used in (e.g. passing through the waterline of) the device. This may be of particular interest where the fluid has to be irradiated/treated while passing through a pipe, or where there is a need to prevent the formation of potential microorganism biofilm inside a pipe, or where the flow needs to be treated at the end of a pipeline before being used. The UV-LED reactor may be integrated in the device along with one or more other forms of water purification methods (such as filtration). Exemplary point-of-use fluid treatment applications of the UV-LED reactor are next described with references to FIGS. 7 to 9.

Figure 7:
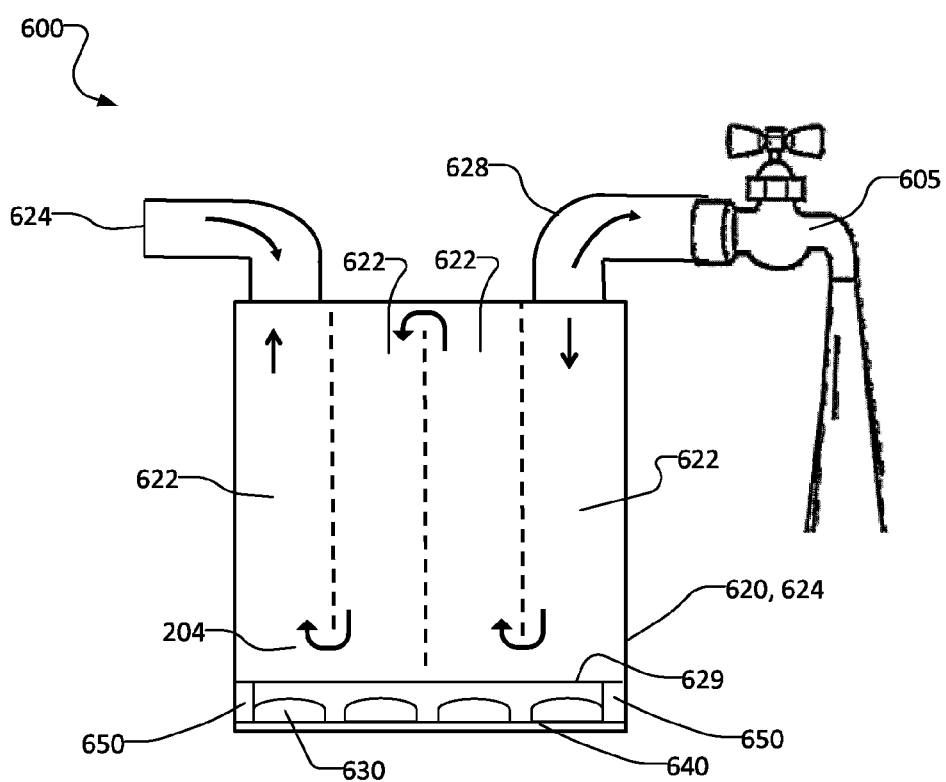

FIG. 7 shows a water treatment system 600, comprising an inlet pipe 626, an outlet pipe 628, and a water tap 605, and incorporating a UV-LED reactor 610 operated with UV-LEDs 630 for the treatment of water. The water enters the reactor 610 via inlet 626, passes through the UV-LED reactor 610, and is irradiated by UV radiation emitted from the UV-LEDs 630, prior to exiting from outlet pipe 638 and going to the tap 605 for general use. The general fluid flow directions are shown by the arrows. Many features and components of reactor 610 are similar to feature and components of reactor 10, with the same reference numerals preceded by the digit "6" being used to indicate features and component of reactor 600 that are similar to those of reactor 10.

In some embodiments, the UV-LED reactor may be incorporated in appliances that dispense or use water (or water-based fluids) for human consumption, such as freezers, water coolers, coffee makers, vending machines, and the like. The water used for human consumption needs a high degree of purification. The main water supply for refrigerators, freezers, and water coolers, for example, may contain harmful pathogens. This is of particular concern in developing countries and remote areas where water may not be treated properly before distribution in the water network. In addition, due to its particular structure, a refrigerator/freezer waterline may be prone to biofilm and microbial contamination. Polymeric tubing typically transfers water from the main water supply to refrigerators to be used in through-the-door ice and drinking water. Bacterial biofilm can form in the waterline, in particular when the water is not in use (e.g., biofilm can form within 8 hours). Intermittent patterns of water use lead to stagnation of the entire water column within the waterlines for extended periods during the day. The susceptibility of water supply tubes to colonization of bacteria on surfaces and formation of biofilm is a well-recognized problem.

The UV-LEDs of the reactor may be turned on and off automatically in response to the water starting and stopping flowing. Sensors may be used to detect the flow of fluid and send a signal to the reactor to turn the UV-LEDs on or off. The UV-LED reactor may reduce the microbial contamination in the water leaving the waterline (for consumption) and reduce the risk for infection. This is facilitated by the operating conditions of UV-LEDs. For example, a UV-LED can operate at a range of temperatures and can be turned on and off with high frequency, which is particularly important for refrigerator and water cooler applications.

Figure 8:
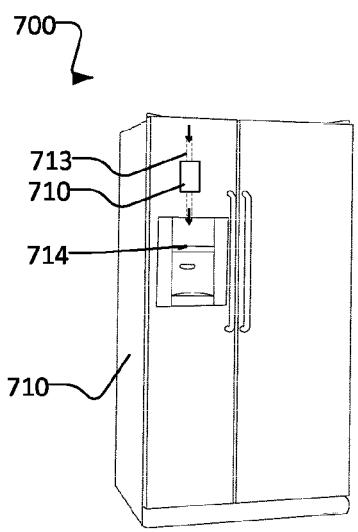

Any appliances which dispense or use water or water-based fluids (e.g. coffee or other beverages) intended for human consumption may incorporate a UV-LED reactor according to the embodiments described herein to treat the water. For example, FIG. 8 shows a refrigerator 700 comprising a body 711 and a pipe 713 for delivering water to a water/ice dispenser 714. Refrigerator 700 incorporates a UV-LED reactor 710. Many features and components of reactor 710 are similar to feature and components of reactor 10, with the same reference numerals preceded by the digit "7" being used to indicate features and component of reactor 710 that are similar to those of reactor 10. The water flowing in the pipe 713 passes through the UV-LED reactor 710 where it is irradiated by UV radiation prior to entering the water/ice dispenser 714. The general fluid flow directions are shown by the arrows. Similarly, other appliances which may benefit from incorporating a UV-LED reactor include, without limitation, freezers, ice machines, frozen beverage machines, water coolers, coffee makers, vending machines and the like.

Other applications of the UV-LED reactor according to the embodiments described herein include the treatment of water or other fluids used in or by healthcare or dental-related or medical devices or facilities, either for operation, cleaning or another purpose which requires clean water. In particular, many healthcare applications require water quality to be of a higher standard than drinking water. The efficiency and compactness of the UV-LED reactors described herein may make them more attractive than conventional UV-lamp reactors for implementation in healthcare devices.

Figure 9:
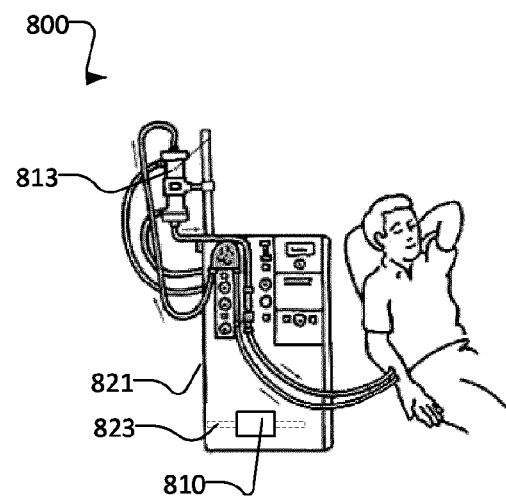

For example, FIG. 9 shows a hemodialysis machine 800 comprising a body 821 and a pipe 823 containing a UV-LED reactor 810. The water flowing in the pipe 823 passes through the UV-LED reactor 810 for treatment prior to use in the hemodialysis machine. Many features and components of reactor 810 are similar to feature and components of reactor 10, with the same reference numerals preceded by the digit "8" being used to indicate features and component of reactor 810 that are similar to those of reactor 10. Similarly, other appliances which may benefit from incorporating the UV-LED reactor include, without limitation, colon hydrotherapy equipment, and dental equipment which dispenses water for cleaning or operation, or the like.

With respect to applications in dental equipment, surveys of dental unit waterlines (DUWLs) indicate that biofilm formation is a problem and a great majority of bacteria that have been identified in DUWL are ubiquitous. Although such bacteria may be present in only low numbers in domestic water distribution systems, they can flourish as biofilms on the lumen surfaces of narrow-bore waterlines in dental units. Microorganisms from contaminated DUWL are transmitted with aerosol and splatter, generated by working unit hand-pieces. Various studies emphasize the need for reducing the microbial contamination in DUWL.

In some embodiments, a UV-LED reactor may be incorporated in a dental unit to treat the water used in the unit. The UV-LED reactor may be integrated in the dental units (such as a dental chairs) or the UV-LED reactor may be placed within the tray of the dental chair (assistant tray) holding the water spry, or within the water spray handle, or somewhere else through the waterline, for the treatment of the water prior to use. Features including instant on and off may be included in the UV-LED reactor integrated in a dental unit.

Some embodiments comprise UV-LEDs which are operated in a pulsed mode. For example, the LEDs may be pulsed at high frequencies. This mode of operation may affect the photoreaction rate as well as the photocatalyst's electron-hole recombination so as to increase photocatalytic efficiencies.

The UV-LEDs may be programmed to turn on and off automatically in some embodiments. For example it may be desirable to turn on/off the UV-LEDs as the fluid flow starts or stops moving in the reactor (which may be useful for water purification in point-of-use applications), or at specific time intervals. To control the UV-LEDs' on/off status, a sensor may be used to detect the fluid motion in the fluid flow channels. Alternatively, a user may activate a sensor physically, either directly (for example, by turning a switch on and off), or as an indirect action (for example, through turning a tap on and off). This feature may advantageously save energy used by the reactor. As another example, it may be desirable to turn on/off the UV-LEDs at specific time intervals for cleaning of the UV reactor chamber when it is not in operation for some time, in order to prevent any potential growth of microorganisms, diffusion of microorganisms from untreated upstream fluid, and/or to prevent any biofilm formation. To control the UV-LEDs' on/off status, a microcontroller may be applied and programmed to turn the UV-LEDs on for a period of time (for example, a few seconds), at specific time intervals (for example, once every few hours).

In some embodiments, at least some of the UV-LEDs may be programmed to adjust their power output or to turn on or off automatically, in response to receiving a signal. The signal may be generated, for example, as the flow rate (or other measurable characteristic) of the fluid passing through the UV-LED reactor changes. In embodiments where the fluid is water, the measurable characteristic may be one that is indicative of the water quality or concentration of contaminants. Examples of water quality indicators include UV transmittance and turbidity. This configuration may facilitate appropriate radiation energy being directed to the fluid based on the particular operating conditions.

In some embodiments, a visual indicator, such as for example a liquid crystal display (LCD) or a radiation signal (such as a colored LED) may be provided on the UV-LED reactor, or in another visible place (for example, on the tap if the application is water treatment) to inform the user of the status of the reactor and UV-LEDs. As an example, when the UV-LEDs are on, a sign on the LCD can be displayed or a colored LED can be turned on which indicates the "on" status of the UV-LEDs to the user.

Further example embodiments of UV-LED based photoreactors which could incorporate the heat dissipation and thermal management methods and apparatus described herein are described in U.S. Application No. 62/280,630 filed on 19 Jan. 2016 and entitled HEAT DISSIPATION APPARATUS AND METHODS FOR UV-LED PHOTOREACTORS, which is incorporated herein by reference.

Interpretation of Terms

Unless the context clearly requires otherwise, throughout the description and the
- "comprise", "comprising", and the like are to be construed in an inclusive sense, as opposed to an exclusive or exhaustive sense; that is to say, in the sense of "including, but not limited to";
- "connected", "coupled", or any variant thereof, means any connection or coupling, either direct or indirect, between two or more elements; the coupling or connection between the elements can be physical, logical, or a combination thereof;
- "herein", "above", "below", and words of similar import, when used to describe this specification, shall refer to this specification as a whole, and not to any particular portions of this specification;
- "or", in reference to a list of two or more items, covers all of the following interpretations of the word: any of the items in the list, all of the items in the list, and any combination of the items in the list;
- the singular forms "a", "an", and "the" also include the meaning of any appropriate plural forms.

Words that indicate directions such as "longitudinal", "transverse", "horizontal", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Where a component (e.g. a substrate, assembly, device, manifold, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments described herein.

Specific examples of systems, methods, and apparatus have been described herein for purposes of illustration.

These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

What is claimed is:

1. An ultraviolet (UV) reactor for irradiating a flow of fluid with UV radiation, the reactor comprising:
   a fluid conduit comprising at least one fluid conduit-defining wall and one or more thermally conductive materials in the at least one fluid conduit-defining wall;
   a printed circuit board (PCB) comprising a heat conducting substrate having a first surface comprising a circuit region;
   a solder mask coating on the circuit region of the first surface of the heat conducting substrate; and
   a UV light emitting diode (UV-LED) operatively connected to the PCB, the UV-LED oriented for directing radiation into the fluid conduit;
   wherein a thermal contact region of the first surface of the heat conducting substrate is devoid of the solder mask coating and the one or more thermally conductive materials are in thermal contact with the thermal contact region of the first surface of the heat conducting substrate of the PCB.

2. A reactor according to claim 1 wherein:
   the UV-LED is oriented for directing radiation to have a principal optical axis extending in a first direction from the UV-LED to the fluid conduit;
   the first surface of the heat conducting substrate is planar; and
   a normal vector of the first surface of the heat conducting substrate is oriented substantially parallel to the first direction.

3. A reactor according to claim 2 wherein the principal optical axis is generally parallel with a direction of flow of the fluid through the fluid conduit when the fluid flows through the fluid conduit.

4. A reactor according to claim 2 wherein the fluid conduit comprises a plurality of longitudinally extending fluid flow channels, and wherein the principal optical axis is generally parallel with a longitudinal direction of fluid flow through the plurality of longitudinally extending fluid channels when the fluid flows through the fluid conduit.

5. A reactor according to claim 4 wherein the first direction in which the optical axis extends from the UV-LED to the fluid conduit opposes the longitudinal direction of fluid flow in at least one of the plurality of fluid flow channels when the fluid flows through the fluid conduit.

6. A reactor according to claim 4 wherein the first direction in which the optical axis extends from the UV-LED to the fluid conduit is the same as the longitudinal direction of fluid flow in at least one of the plurality of fluid flow channels when the fluid flows through the fluid conduit.

7. A reactor according to claim 1 wherein the thermal contact between the one or more thermally conductive materials and the first surface of the heat conducting substrate of the PCB comprises a thermal contact enhancing component interposed between the one or more thermally conductive materials and the first surface of the heat conducting substrate, the thermal contact enhancing component reducing a thermal contact resistance (increasing the thermal contact conductivity) between the one or more thermally conductive materials and the heat conducting substrate of the PCB.

8. A reactor according to claim 7 wherein the thermal contact enhancing component comprises a thermally conductive and deformable thermal pad.

9. A reactor according to claim 7 wherein the thermal contact enhancing component comprises a thermally conductive gel or paste.

10. A reactor according to claim 1 wherein the thermal contact between the one or more thermally conductive materials and the first surface of the heat conducting substrate of the PCB comprises a heat conducting intermediate component interposed between the one or more thermally conductive materials and the first surface of the heat conducting substrate.

11. A reactor according to claim 1 wherein the first surface of the heat conducting substrate and the UV-LED are on a first side of the heat conducting substrate.

12. A reactor according to claim 11 wherein the solder mask coating of the PCB is removed from the thermal contact region of the PCB.

13. A reactor according to claim 11 wherein a portion of a fluid flow path in the fluid conduit between an inlet of the fluid conduit and an outlet of the fluid conduit is on a second side of the heat conducting substrate opposite the first side of the heat conducting substrate.

14. A reactor according to claim 1 wherein when the fluid flows through the fluid conduit, the fluid flowing through the fluid conduit contacts the one or more thermally conductive materials to dissipate heat from the one or more thermally conductive materials into the fluid.

15. A reactor according to claim 14 wherein when the fluid flows through the fluid conduit, the contact between the fluid flowing through the fluid conduit and the one or more thermally conductive materials occurs, at least in part, inside a UV active region of the reactor.

16. A reactor according to claim 1 wherein:
   the fluid conduit comprises: a plurality of fluid flow channels, each fluid flow channel of the plurality of fluid flow channels comprising a portion of the one or more thermally conductive materials; and a manifold located at the ends of at least two of the plurality of fluid flow channels and shaped to provide fluid communication between the at least two fluid flow channels; and
   the thermal contact between the one or more thermally conductive materials and the first surface of the heat conducting substrate comprises thermal contact between the manifold and the first surface of the heat conducting substrate.

17. A reactor according to claim 16 wherein the manifold is integrally formed with the plurality of fluid flow channels.

18. A reactor according to claim 16 wherein the manifold is joined to, and in thermal contact with, the plurality of fluid flow channels.

19. A reactor according to claim 1 wherein:
   the fluid conduit comprises a plurality of fluid flow channels, each fluid flow channel of the plurality of fluid flow channels comprising a portion of the one or more thermally conductive materials; and
   the thermal contact between the one or more thermally conductive materials and the first surface of the heat conducting substrate of the PCB comprises a heat conducting manifold interposed between the plurality of fluid flow channels and the first surface of the heat conducting substrate.

20. A reactor according to claim 19 wherein the thermal contact between the one or more thermally conductive materials and the first surface of the heat conducting substrate of the PCB comprises a thermal contact enhancing component interposed between the one or more thermally conductive materials and the first surface of the heat conducting substrate, the thermal contact enhancing component reducing a thermal contact resistance (increasing the thermal contact conductivity) between the one or more thermally conductive materials and the heat conducting substrate of the PCB.

21. A reactor according to claim 20 wherein the thermal contact enhancing component comprises a thermally conductive and deformable thermal pad.

22. A reactor according to claim 20 wherein the thermal contact enhancing component comprises a thermally conductive gel or paste.

23. A reactor according to claim 1 comprising:
a thermal contact enhancing component, the thermal contact enhancing component in thermal contact with the one or more thermally conductive materials;
wherein the printed circuit board comprises a thermal contact region in which is devoid of the solder mask coating; and
wherein the thermal contact region of the printed circuit board is in thermal contact with the thermal contact enhancing component to provide thermal contact between the thermal contact region of the printed circuit board, the thermal contact enhancing component, and the one or more thermally conductive materials.

24. A reactor according to claim 23 wherein the thermal contact between the thermal contact region of the printed circuit board, the thermal contact enhancing component, and the one or more thermally conductive materials is made either directly or through other thermally conductive components.

25. A reactor according to claim 23 wherein the fluid conduit comprises: a plurality of fluid flow channels, each flow channel of the plurality of flow channels comprising a portion of the one or more thermally conductive materials; and a manifold shaped for directing fluid between the plurality of fluid flow channels.

26. A reactor according to claim 25 wherein the thermal contact enhancing component comprises a thermally conductive and deformable thermal pad disposed between, and in thermal contact with, the thermal contact region of the printed circuit board and the manifold.

27. A reactor according to claim 1 wherein the fluid conduit comprises at least one thermally conductive material and at least one non-thermally-conductive material.

28. A reactor according to claim 1 wherein the fluid conduit is made of the one or more thermally conductive materials.

29. A reactor according to claim 1 wherein the heat conducting substrate comprises a wall defining a portion of a fluid flow path in the fluid conduit between an inlet of the fluid conduit and an outlet of the fluid conduit.

30. A reactor according to claim 1 wherein the fluid conduit is defined by a heat conducting conduit body.

31. An ultraviolet (UV) reactor for irradiating a flow of fluid with UV radiation, the reactor comprising:
a fluid conduit comprising an inlet and an outlet;
a printed circuit board (PCB) comprising a heat conducting substrate having a first side and a second side opposite the first side, the second side of the heat conducting substrate of the PCB facing a portion of a fluid flow path in the fluid conduit between the inlet of the fluid conduit and the outlet of the fluid conduit; and
a UV light emitting diode (UV-LED) operatively connected to the PCB on the first side of the heat conducting substrate, the UV-LED oriented for directing radiation into the fluid conduit.

32. The UV reactor of claim 31 wherein:
the PCB comprises a circuit region on the second side of the heat conducting substrate, and a solder mask coating on the circuit region of the second side of the heat conducting substrate; and
a thermal contact region of the second side of the heat conducting substrate is devoid of the solder mask coating.

* * * * *